(12) United States Patent
Kauffman et al.

(10) Patent No.: US 12,278,605 B2
(45) Date of Patent: Apr. 15, 2025

(54) BAND PASS FILTER CIRCUIT WITH OVER-VOLTAGE PROTECTION

(71) Applicant: NexTek, LLC, North Billerica, MA (US)

(72) Inventors: George M. Kauffman, Hudson, MA (US); Christopher Aaron Penwell, Cheshire, CT (US)

(73) Assignee: NEXTEK, LLC, North Billerica, MA (US)

( * ) Notice: Subject to any disclaimer, the term of this patent is extended or adjusted under 35 U.S.C. 154(b) by 0 days.

(21) Appl. No.: 18/129,569

(22) Filed: Mar. 31, 2023

(65) Prior Publication Data

US 2023/0318575 A1 Oct. 5, 2023

Related U.S. Application Data

(60) Provisional application No. 63/326,533, filed on Apr. 1, 2022.

(51) Int. Cl.
*H03H 11/04* (2006.01)

(52) U.S. Cl.
CPC .................. *H03H 11/04* (2013.01)

(58) Field of Classification Search
CPC ...................................... H03H 11/04
USPC ......................................... 327/552
See application file for complete search history.

(56) References Cited

U.S. PATENT DOCUMENTS

| | | |
|---|---|---|
| 4,586,104 A | 4/1986 | Standler |
| 5,053,910 A | 10/1991 | Goldstein |
| 5,905,623 A | 5/1999 | McCartney |
| 6,754,060 B2 | 6/2004 | Kauffman |
| 8,116,058 B2 | 2/2012 | Youming et al. |
| 9,785,165 B2 | 10/2017 | Petenyi et al. |
| 10,587,239 B2 | 3/2020 | Kauffman |
| 2013/0328642 A1 | 12/2013 | Ma et al. |
| 2015/0077889 A1* | 3/2015 | Kauffman .............. H03H 7/075 361/56 |

FOREIGN PATENT DOCUMENTS

WO 2005064760 A1 7/2005

\* cited by examiner

*Primary Examiner* — Tomi Skibinski
(74) *Attorney, Agent, or Firm* — KRIEGSMAN & KRIEGSMAN

(57) ABSTRACT

A band pass filter circuit for transmitting electromagnetic signals within a desired frequency band includes a transmission line extending between input and output terminals, a high pass filter connected to the transmission line for blocking the transmission of signals falling below the operational frequency band, and a low pass filter connected to the transmission line for blocking the transmission of signals falling above the operational frequency band. Additionally, a primary suppressor connects the transmission line to ground and suppresses unwanted transients on the transmission line. A set of supplemental suppressors connects the transmission line to ground and suppresses any residual transient energy on the transmission line after treatment by the primary suppressor. Each supplemental suppressor is paired in parallel with a higher-valued capacitor from the low pass filter in order to minimize the effect of its parasitic capacitance on the band pass characteristics of the circuit.

17 Claims, 12 Drawing Sheets

BAND PASS FILTER CIRCUIT WITH OVER-VOLTAGE PROTECTION

CROSS-REFERENCE TO RELATED APPLICATIONS

The present invention claims the benefit under 35 U.S.C. 119(e) to U.S. Provisional Patent Application No. 63/326,533, which was filed on Apr. 1, 2022, in the name of George M. Kauffman.

FIELD OF THE INVENTION

The present invention relates generally to band pass filters for transmitting electromagnetic signals of a desired frequency range and, more particularly, to band pass filters that additionally provide over-voltage protection.

BACKGROUND OF THE INVENTION

In electric communications. a transmission line, or signal path, is a structure designed to efficiently transmit electromagnetic signals, such as radio frequency (RF) signals, from a signal source to a load. The transmission line formed between the signal source and the load is commonly established using one or more electric devices, such as coaxial cables, connectors, and switches.

Electric devices of the type described above are widely used to transmit electromagnetic signals with minimum loss and limited distortion. As a result, these types of electric devices are commonly used to transmit and receive signals in telecommunications, broadcast, military, security, and civilian transceiver applications, as well as numerous additional uses.

A band pass filter circuit, also referred to herein simply as a band pass filter, is one well-known type of electric device which transmits electromagnetic signals along a transmission line. A band pass filter is designed to transmit electromagnetic energy of an operational frequency band along the transmission line. Signals which fall outside of the desired frequency range are otherwise attenuated, or blocked, from transmission to the load.

An RF transmission line is susceptible to receiving high-voltage transient electromagnetic energy, for instance, as the result of a lightning strike or electro-static discharge. This high-voltage energy is potentially harmful to not only a load in connection with the transmission line but also any voltage-sensitive circuit components present in an electric device which is used to define the signal path.

Accordingly, band pass filters are often designed with over-voltage protection capabilities in order to treat potentially harmful transient energy. For example, a band pass filter with over-voltage protection is described in U.S. Patent Application Publication 2015/0077889 to G. M. Kauffman (hereinafter the '889 application), the disclosure of which is incorporated herein by reference.

In FIG. 1, a traditional band pass filter circuit with over-voltage protection is shown in detail, the band pass filter circuit being represented generally by reference numeral 11. As can be seen, band pass filter circuit 11 comprises (i) a transmission line, or signal path, 13 that extends in electrical communication between an input, or exposed, terminal 15-1 and an output, or treated, terminal 15-2, (ii) a first series capacitor 17-1 and a first series inductor 19-1 connected in series on transmission line 13 between terminals 15-1 and 15-2, (iii) a second series capacitor 17-2 and a second series inductor 19-2 connected in series on transmission line 13 between first series capacitor 17-1 and output terminal 15-2, (iv) a first shunt capacitor 21 and a first shunt inductor 23 connected in parallel, each of first shunt capacitor 21 and first shunt inductor 23 connecting transmission line 13 to a ground plane, or terminal, 25, with each of first shunt capacitor 21 and first shunt inductor 23 being connected to transmission line 13 between first and second series capacitors 17-1 and 17-2, and (v) a gas discharge tube (GDT) 27 connecting transmission line 13 to ground terminal 25, GDT 27 being connected to transmission line 13 between input terminal 15-1 and first series inductor 19-1.

Band pass filter 11 is designed to limit the transmission of RF energy along transmission line 13 to those signals which fall within a designated frequency band. It should be noted that the various components which define the low pass characteristics of circuit 11 are interspersed, or mixed, with the components which define the high pass characteristics of circuit 11. Namely, the low pass characteristics of filter 11 (i.e., the highest frequency signals that are passed to terminal 15-2) are defined by shunt capacitor 21 and series inductors 19-1 and 19-2. Further, the high pass characteristics of filter 11 (i.e., the lowest frequency signals that are passed to terminal 15-2) are defined by shunt inductor 23 and series capacitors 17-1 and 17-2. Based on the value of each of the aforementioned components, the center frequency and bandwidth of band pass filter 11 is defined.

Upon receiving any very high electrical current along signal path 13 (e.g., as the result of a lightning strike), GDT 27 turns on, or fires, and thereby suppresses the potentially harmful energy. As a result, any low-voltage circuitry connected to output terminal 15-2 is protected from the unwanted, high-voltage energy.

Although a gas discharge tube can operate over a wide range of frequencies (even well over 1 GHz) and exhibits very high transient current shunting capabilities, GDTs typically respond too slowly to fast rise time transients. As a result, when treating transient energy, a gas discharge tube often produces a very high firing voltage, or overshoot. This firing voltage is typically generated as a wide-band pulse of substantial energy, with a significant portion of this energy often falling within the operational frequency band for the filter. As a result, a sizable amount of the high-voltage impulse generated by the GDT is passed through the transmission line and, in turn, may be sufficient to permanently damage sensitive electrical components and equipment connected to the signal path.

Accordingly, it is known in the art for additional protective devices to be incorporated into traditional bandpass filters (e.g., band pass filter 11) in order to treat any residual high-voltage electromagnetic energy that remains on the transmission line after the firing of the GDT. Typically, additional protective devices are connected to the transmission line towards the output terminal.

As an example, shunting protectors, such as quarter-wave shunts or inductors, are commonly incorporated into band pass filter circuits to ground undesirable electromagnetic energy present along the transmission line. However, it has been found that shunting protectors are often ineffective at treating potentially destructive energy that falls within the operational frequency band.

As another example, a semi-conductor clamping component (e.g., a diode-based component, metal-oxide varistor (MOV)-based component, silicon-controller rectifier (SCR)-based component, protection thyristor-based component, or triode for alternating current (TRIAC)-based component) is often incorporated into a band pass filter circuit to treat any residual high-voltage electromagnetic energy that remains on the transmission line after firing of the GDT.

Although effective in treating residual high-voltage electromagnetic energy, semi-conductor clamping components utilized in band pass filters often introduce a notable shortcoming. Specifically, semi-conductor clamping components often exhibit a sizable parasitic capacitance which, in turn, can affect the band pass characteristics of the filter circuit. Furthermore, the parasitic capacitance exhibited by semi-conductor clamping components is relatively instable and fluctuates, thereby creating uncontrollable variances in the band pass characteristics of the circuit.

SUMMARY OF THE INVENTION

It is an object of the present invention to provide a new and improved band pass filter circuit for transmitting electromagnetic signals of a desired frequency band.

It is another object of the present invention to provide a band pass filter as described above that is additionally designed to effectively suppress any potentially harmful, transient, high-voltage electromagnetic energy present on the transmission line.

It is yet another object of the present invention to provide a band pass filter as described above which is designed to maintain its band pass characteristics fixed and stable.

It is still another object of the present invention to provide a band pass filter as described above which has a limited number of parts, is inexpensive to manufacture, and efficiently transmits electromagnetic signals with minimum loss and limited distortion.

Accordingly, as one feature of the present invention, there is provided a band pass filter circuit for transmitting electromagnetic signals of an operational frequency band, the band pass filter circuit comprising (a) a transmission line connecting an input terminal to an output terminal, (b) a high pass filter for blocking transmission to the output terminal of electromagnetic signals received by the transmission line that fall below the operational frequency band, at least a portion of the high pass filter being connected in series with the transmission line between the input terminal and the output terminal, (c) a low pass filter for blocking transmission to the output terminal of electromagnetic signals received by the transmission line that fall above the operational frequency band, the low pass filter being separate from the high pass filter, at least a portion of the low pass filter being connected in series with the transmission line between the high pass filter and the output terminal, (d) a primary suppressor for clamping high-voltage, transient electromagnetic energy received by the transmission line, the primary suppressor connecting the transmission line to a ground terminal, the primary suppressor being connected to the transmission line between the input terminal and the high pass filter, and (e) a set of supplemental suppressors for clamping high-voltage, transient electromagnetic energy received by the transmission line, each of the set of supplemental suppressors connecting the transmission line to the ground terminal, each of the set of supplemental suppressors being connected to the transmission line between the high pass filter and the output terminal.

Various other features and advantages will appear from the description to follow. In the description, reference is made to the accompanying drawings which form a part thereof, and in which is shown by way of illustration, an embodiment for practicing the invention. The embodiment will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings, wherein like reference numerals represent like parts.

DETAILED DESCRIPTION OF THE INVENTION

Band Pass Filter Circuit 111

Figure 1:
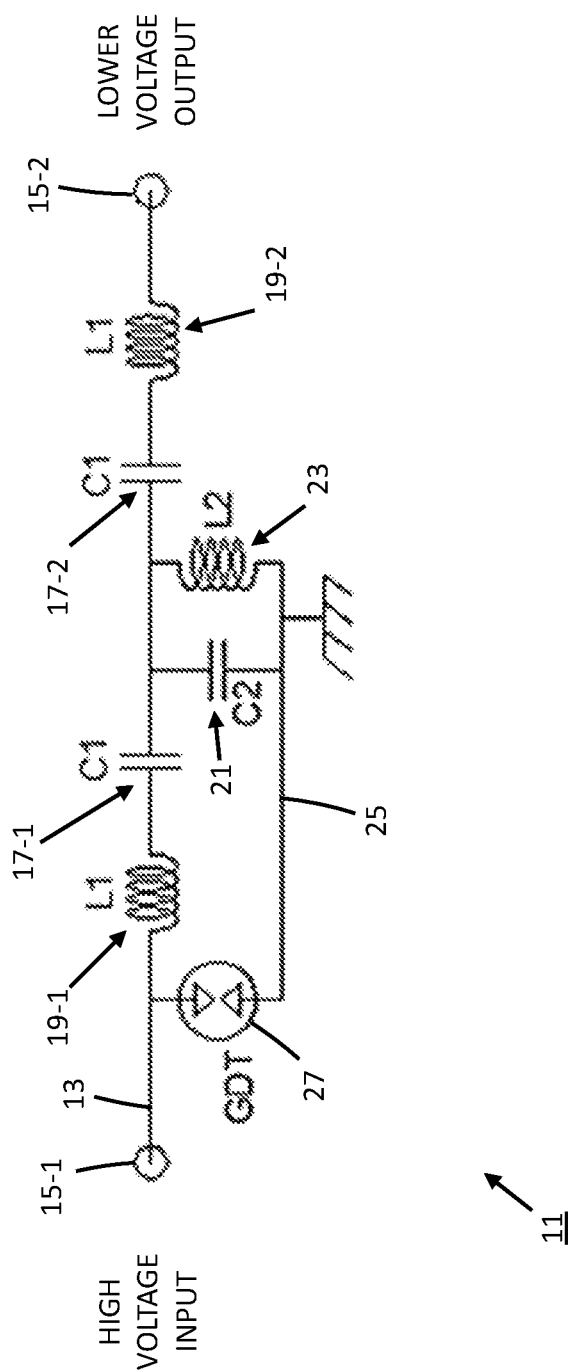
FIG. 1 is a schematic representation of a band pass filter circuit which is known in the art.
Figure 2:
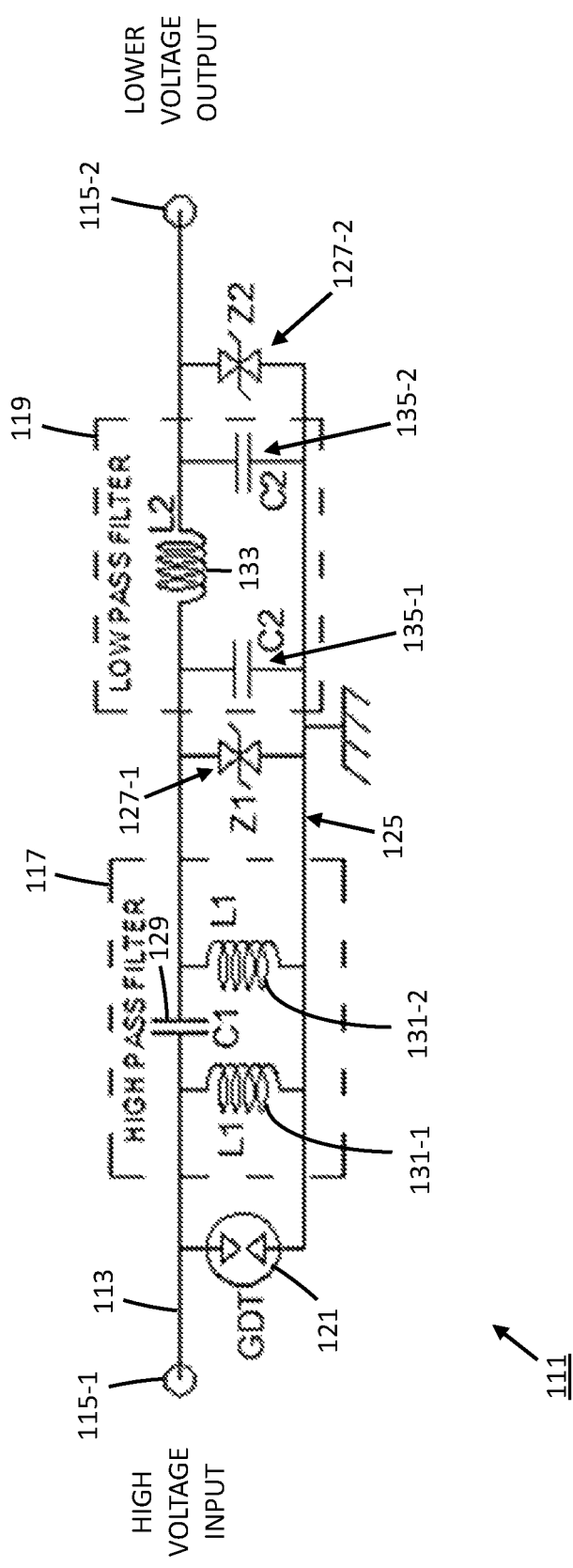
FIG. 2 is a schematic representation of a first embodiment of a band bass filter circuit constructed according to the teachings of the present invention.

Referring now to FIG. 2, there is shown a first embodiment of a band pass filter circuit constructed according to the teachings of the present invention, the circuit being defined generally by reference numeral 111. In use, band pass filter circuit 111 is designed to transmit radio frequency (RF) signals of a designated frequency band along a transmission line between a source and a load. Additionally, band pass filter circuit 111 is designed to suppress unwanted transient voltages (e.g., of the type caused by lightning strikes or electro-static discharge) present on the transmission line and thereby protect any voltage-sensitive circuit components or equipment connected thereto.

As can be seen, band pass filter circuit 111 comprises (i) a transmission line, or signal path, 113 that extends in electrical communication between an input, or exposed, terminal 115-1 and an output, or treated, terminal 115-2, (ii) a high pass filter 117 connected to transmission line 113 between input terminal 115-1 and output terminal 115-2, (iii) a low pass filter 119 connected to transmission line 113 between high pass filter 117 and output terminal 115-2, (iv) a primary suppression element, or suppressor, 121 connecting transmission line 113 to a ground terminal, or plane, 123, with primary suppressor 121 being connected to transmission line 113 between input terminal 115-1 and high pass filter 117, and (v) a set of supplemental suppression elements, or suppressors, 127 connecting transmission line 113 to ground terminal 123.

As noted above, band pass filter circuit 111 is designed to limit the transmission of RF energy along transmission line 113 to only those signals which fall within the operational frequency band (e.g., between 1 MHz and 40 MHz). More specifically, high pass filter 117 is designed to block the transmission of RF signals that fall below the operational frequency band. Further, low pass filter 119 is designed to block the transmission of RF signals that fall above the operational frequency band. As can be appreciated, the particular values selected for the components which define each of high pass filter 117 and low pass filter 119 largely define the center frequency and signal bandwidth for circuit 111.

As a feature of the present invention, band pass filter circuit 111 is constructed with high pass filter 117 and low pass filter 119 separate from one another and, in turn, connected to transmission line 113 at distinct locations along its path. As will be explained further below, applicant has uniquely recognized that by separating high pass filter 117 and low pass filter 119, circuit 111 can be designed to provide highly reliable over-voltage suppression, while maintaining stable band pass characteristics. Additionally, due to its unique design, circuit 111 can be easily modified to customize its use for the transmission of RF signals within certain frequency ranges.

High pass filter 117 comprises (i) a series capacitor 129 connected in series with transmission line 113 between input terminal 115-1 and low pass filter 119, and (ii) first and second shunt inductors 131-1 and 131-2 which extend between transmission line 113 and ground terminal 125, with first shunt inductor 131-1 being connected to transmission line 113 between input terminal 115-1 and series capacitor 129 and second shunt inductor 131-2 being connected to transmission line 113 between series capacitor 129 and low pass filter 119. Preferably, series capacitor 129 has a high-voltage rating, thereby rendering it suitable for withstanding overshoot from primary suppressor 121.

In addition to helping define the high pass characteristics for circuit 111, both shunt inductors 131 may provide additional suppression of transient energy present on transmission line 113, depending upon the waveform of the input transient and the operational high pass frequency. Furthermore, shunt inductor 131-1 may assist primary suppressor 121 in conducting a significant portion of an untreated transient current, depending upon the input pulse width, its inductance value, and its equivalent series resistance.

Low pass filter 119 comprises (i) a series inductor 133 connected in series with transmission line 113 between high pass filter 117 and output terminal 115-2, and (ii) first and second shunt capacitors 135-1 and 135-2 which extend between transmission line 113 and ground terminal 125, with first shunt capacitor 135-1 being connected to transmission line 113 between high pass filter 117 and series inductor 133 and second shunt capacitor 135-2 being connected to transmission line 113 between series inductor 133 and output terminal 115-2. In addition to helping define the low pass characteristics for circuit 111, series inductor 133 may provide additional suppression of residual transient energy present on transmission line 113 after initial treatment by primary suppressor 121.

In the present embodiment, primary suppressor 121 is represented as a single gas charge tube (GDT). It should be noted that a gas discharge tube is particularly well suited for use as the primary suppressor of high-voltage transient energy received by transmission line 113 to due to its very high current-handling capability and relatively low capacitance.

In use, upon receiving any very high electrical current along signal path 113 (e.g., as the result of a lightning strike), GDT 121 turns on, or fires, and thereby suppresses the potentially harmful energy. As a result, any voltage-sensitive components or equipment connected to transmission line 113 are protected from the unwanted, high-voltage energy.

Any overshoot, or firing voltage, produced by GDT 121 is preferably treated, at least in part, by supplemental suppressors 127-1 and 127-2. As can be seen, first supplemental suppressor 127-1 extends between transmission line 113 and ground terminal 125, with first supplemental suppressor 127-1 being connected to transmission line 113 between high pass filter 117 and low pass filter 119. Similarly, second supplemental suppressor 127-2 extends between transmission line 113 and ground terminal 125, with second supplemental suppressor 127-2 being connected to transmission line 113 between low pass filter 119 and output terminal 115-2.

It is to be understood that the incorporation of multiple supplemental suppressors 127 into circuit 111 more effectively ensures that any residual transient energy present on transmission line 113 is effectively treated. As a result, any voltage-sensitive components connected to transmission line 113 (e.g., via output terminal 115-2) remain suitably protected from high-voltage transients, which is a principal object of the present invention.

In the present embodiment, each supplemental suppressor 127 is represented as a Zener diode. However, it is to be understood that alternative types of conventional suppression elements could be used in place thereof without departing from the spirit of the present invention. For instance, each supplemental suppressor 127 could be in the form of, inter alia, any diode-based clamping component, any metal-oxide varistor (MOV)-based clamping component, any silicon-controller rectifier (SCR)-based clamping component, any protection thyristor-based clamping component, any triode for alternating current (TRIAC)-based clamping component, or any other suitable semi-conductor clamping component that is effective in treating any residual high-voltage electromagnetic energy that remains on transmission line 113 after firing of GDT 121.

As a primary feature of the present invention, circuit 111 is uniquely designed to minimize the effect of any parasitic capacitance from supplemental suppressors 127. Ordinarily, the relatively high and fluctuating parasitic capacitance of semi-conductor clamping components (e.g., a Zener diode) has a deleterious effect on the band pass characteristics of a filter circuit 111. In fact, it has been found that a Zener diode can vary in capacitance by as much as +/−20% based on component-to-component variations, applied voltage, signal frequency, and, to a limited extent, ambient temperature.

To maintain the band pass characteristics of circuit 111 in a fixed and stable fashion, each supplemental suppressor 127 is directly paired in parallel with a corresponding shunt capacitor 135 of low pass filter 119. More particularly, Zener diode 127-1 is paired in parallel with first shunt capacitor 135-1 and Zener diode 127-2 is paired in parallel with second shunt capacitor 135-2.

By selecting the value of each shunt capacitor 135 to be at least two-times and, more preferably, at least five-times greater than the mean parasitic capacitance of each Zener diode 127, the band pass characteristics of circuit 111 remain fixed and stable. In other words, the otherwise deleterious effects of parasitic capacitance on the band pass characteristics of circuit 111 are rendered largely inconsequential by pairing each supplemental suppressor 127 in parallel with a shunt capacitor 135 which is significantly greater in value. This ability to pair each supplemental suppressor 127 in parallel with a shunt capacitor 135 is accomplishable, in part, because high pass filter 117 and low pass filter 119 are separately constructed (i.e., without interspersed components).

Alternative Constructions and Design Modifications

The invention described in detail above is intended to be merely exemplary and those skilled in the art shall be able to make numerous variations and modifications to it without departing from the spirit of the present invention. All such variations and modifications are intended to be within the scope of the present invention as defined in the appended claims.

Figure 3:
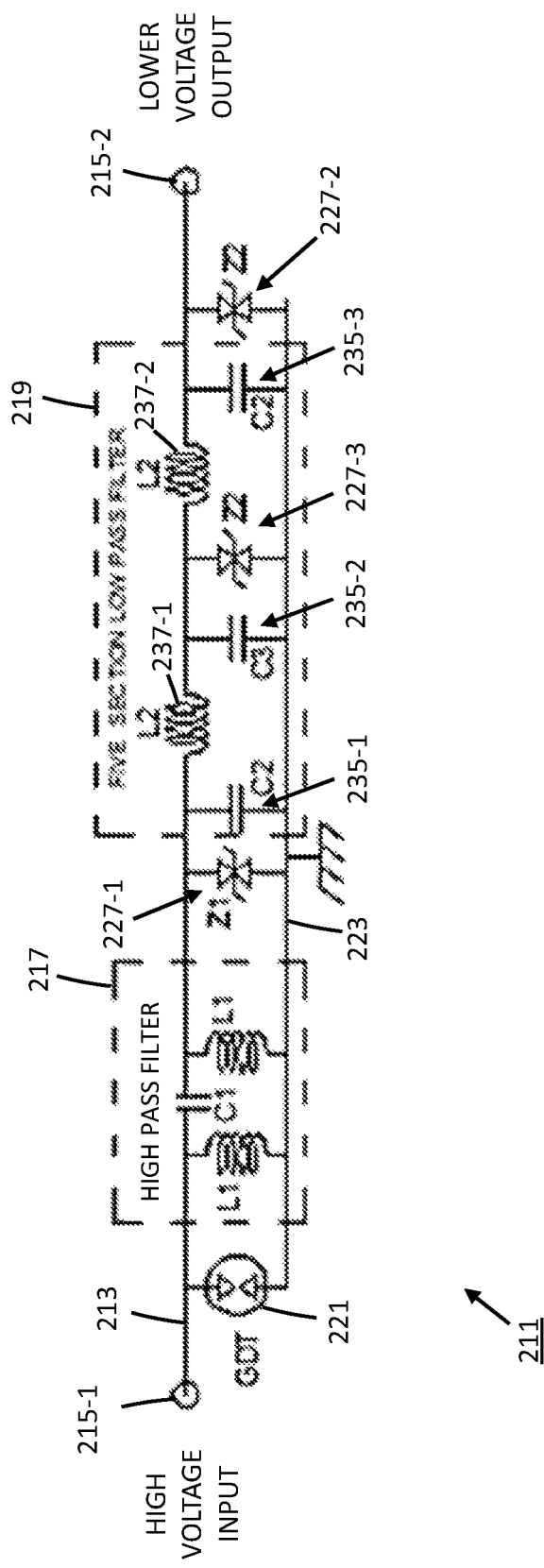
FIG. 3 is schematic representation of a second embodiment of a band bass filter circuit constructed according to the teachings of the present invention.

For instance, in FIG. 3, there is shown a second embodiment of a band pass filter circuit constructed according to the teachings of the present invention, the circuit being defined generally by reference numeral 211. As can be seen, band pass filter circuit 211 is similar to band pass filter circuit 111 in that band pass filter circuit 211 comprises (i) a transmission line, or signal path, 213 that extends in electrical communication between an input, or exposed, terminal 215-1 and an output, or treated, terminal 215-2, (ii) a high pass filter 217 connected to transmission line 213 between input terminal 215-1 and output terminal 215-2, (iii) a low pass filter 219 connected to transmission line 213 between high pass filter 217 and output terminal 215-2, (iv) a primary suppression element, or suppressor, 221 connecting transmission line 213 to a ground terminal, or plane, 223, with primary suppressor 221 being connected to transmission line 213 between input terminal 215-1 and high pass filter 217, and (v) a set of supplemental suppression elements, or suppressors, 227 connecting transmission line 213 to ground terminal 223.

Band pass filter circuit 211 differs primarily from band pass filter circuit 111 in the construction of low pass filter 219. Specifically, low pass filter 219 is constructed as a five-section low pass filter which includes (i) first, second, and third shunt capacitors 235-1, 235-2, and 235-3 which extend between transmission line 213 and ground terminal 225, (ii) a first series inductor 237-1 connected in series with transmission line 213 between first shunt capacitor 235-1 and second shunt capacitor 235-2, and (iii) a second series inductor 237-2 connected in series with transmission line 213 between second shunt capacitor 235-2 and third shunt capacitor 235-3.

By utilizing a five-section low pass filter 219 with three separate shunt capacitors 235, a greater number of supplemental suppressors 227 can be incorporated into band pass filter circuit 211. As a result, band pass filter circuit 211 is designed to provide enhanced transient protection while maintaining stable band pass characteristics. Similar to band pass filter circuit 111, first supplemental suppressor 227-1 is paired directly in parallel with shunt capacitor 235-1 and second supplemental suppressor 227-2 is paired directly in parallel with shunt capacitor 253-3. However, because low pass filter 219 is designed with an additional shunt capacitor 235-2, a third supplemental suppressor 227-3 can be integrated into low pass filter 219 and paired directly with shunt capacitor 235-2 to minimize the effects of its parasitic capacitance. It is to be understood that an even greater number of supplemental suppressors 227 could be incorporated into band pass filter circuit 211 by increasing the number of sections in each of high pass filter 217 and low pass filter 219.

Figure 4:
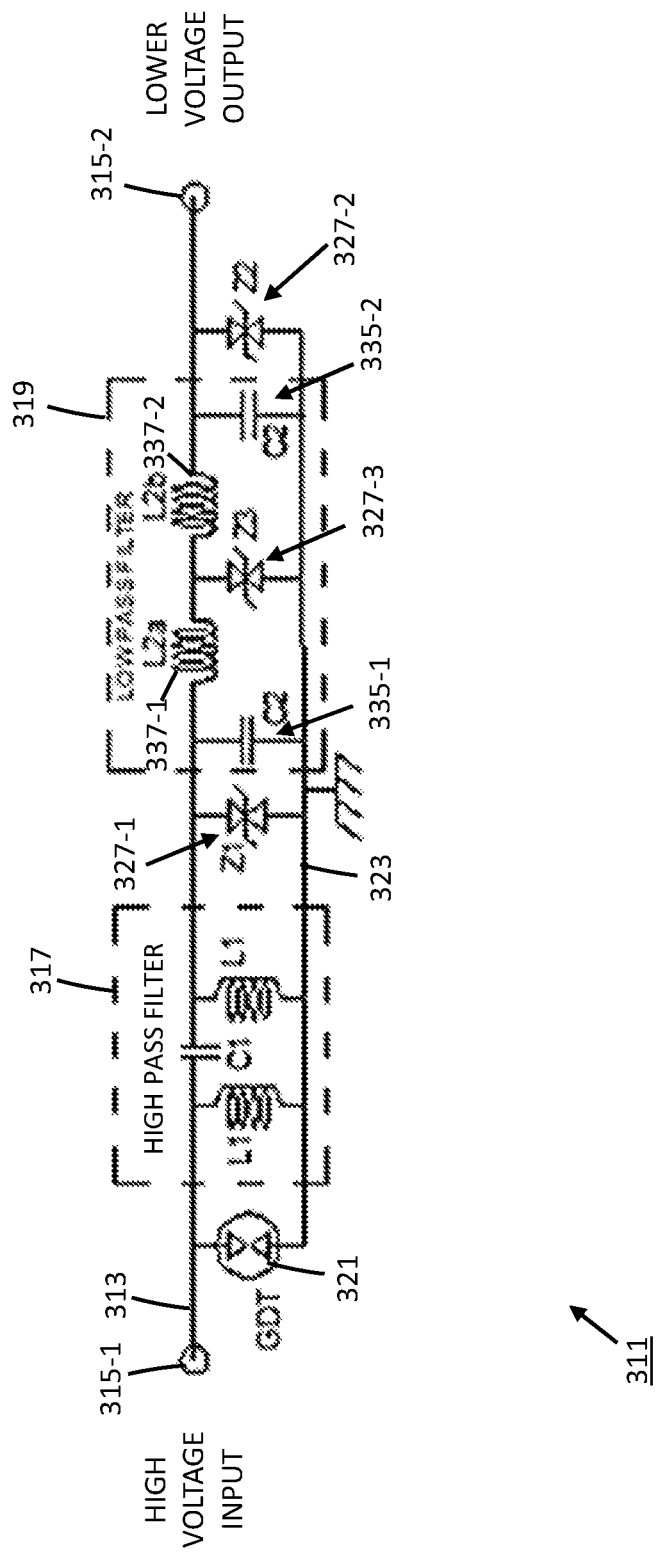
FIG. 4 is schematic representation of a third embodiment of a band bass filter circuit constructed according to the teachings of the present invention.

Referring now to FIG. 4, there is shown a third embodiment of a band pass filter circuit constructed according to the teachings of the present invention, the circuit being defined generally by reference numeral 311. As can be seen, band pass filter circuit 311 is similar to band pass filter circuit 211 in that band pass filter circuit 311 comprises (i) a transmission line, or signal path, 313 that extends in electrical communication between an input, or exposed, terminal 315-1 and an output, or treated, terminal 315-2, (ii) a high pass filter 317 connected to transmission line 313 between input terminal 315-1 and output terminal 315-2, (iii) a low pass filter 319 connected to transmission line 313 between high pass filter 317 and output terminal 315-2, (iv) a primary suppression element, or suppressor, 321 connecting transmission line 313 to a ground terminal, or plane, 323, with primary suppressor 321 being connected to transmission line 313 between input terminal 315-1 and high pass filter 317, and (v) a set of supplemental suppression elements, or suppressors, 327 connecting transmission line 313 to ground terminal 323.

Band pass filter circuit 311 differs primarily from band pass filter circuit 211 in the construction of low pass filter 319. Specifically, low pass filter 319 is constructed with only two shunt capacitors 335-1 and 335-2. However, band pass filter circuit 311 is still able to incorporate three separate supplemental suppressors 327-1, 327-2, and 327-3. Similar to band pass filter circuit 211, first supplemental suppressor 327-1 is paired directly in parallel with shunt capacitor 335-1 and second supplemental suppressor 327-2 is paired directly in parallel with shunt capacitor 335-3. By selecting a third supplemental suppressor 327-3 with minimal capacitance relative to shunt capacitors 335-1 and 335-2, third supplemental suppressor 327-3 can be directly integrated into low pass filter 319 even though not directly paired in parallel with a corresponding shunt capacitor 335 since the parasitic capacitance of third supplemental suppressor 327-3 would have a minimal effect on the overall band pass characteristics.

Without the presence of a third shunt capacitor 335, inductance within the low pass filter 319 is preferably split between (i) a first series inductor 337-1 connected in series with transmission line 313 between first shunt capacitor 335-1 and third supplemental suppressor 327-3, and (ii) a second series inductor 337-2 connected in series with transmission line 313 between third supplemental suppressor 327-3 and second shunt capacitor 335-2.

Figure 5:
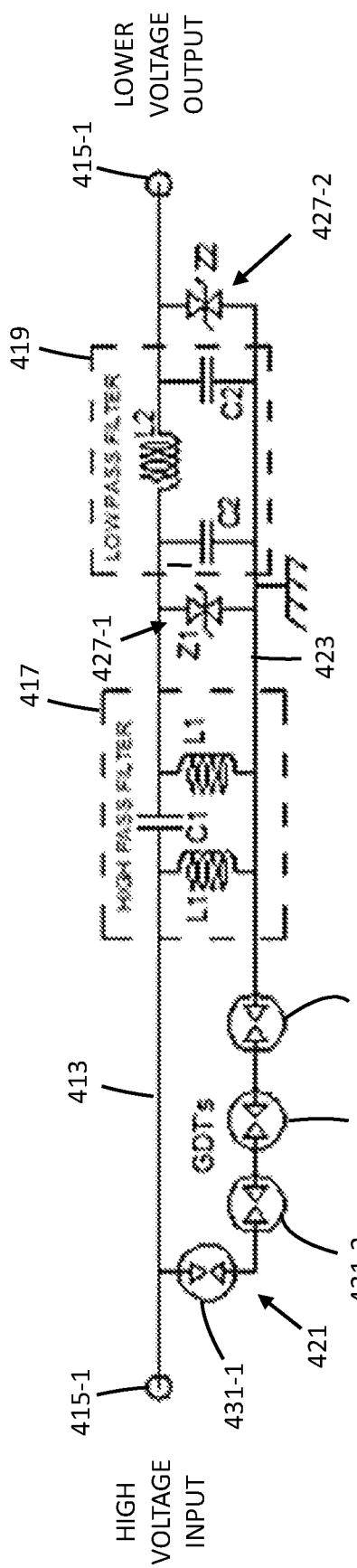
FIG. 5 is a schematic representation of a fourth embodiment of a band pass filter circuit constructed according to the teachings of the present invention.

As referenced previously, the unique design of band pass filter circuit 111 allows for modifications to be implemented to customize its use for specific applications. For instance, in FIG. 5, band pass filter circuit 111 is modified for use in the transmission of high RF power, the modified band pass filter circuit being represented generally by reference numeral 411.

As can be seen, band pass filter circuit 411 is similar to band pass filter circuit 111 in that band pass filter circuit 411 comprises (i) a transmission line, or signal path, 413 that extends in electrical communication between an input, or exposed, terminal 415-1 and an output, or treated, terminal 415-2, (ii) a high pass filter 417 connected to transmission line 413 between input terminal 415-1 and output terminal 415-2, (iii) a low pass filter 419 connected to transmission line 413 between high pass filter 417 and output terminal 415-2, (iv) a primary suppression element, or suppressor, 421 connecting transmission line 413 to a ground terminal, or plane, 423, with primary suppressor 421 being connected to transmission line 413 between input terminal 415-1 and high pass filter 417, and (v) a set of supplemental suppression elements, or suppressors, 427 connecting transmission line 413 to ground terminal 423.

Band pass filter circuit 411 differs primarily from band pass filter circuit 111 in the construction of primary suppressor 421. Specifically, in order to reduce shunt current of the high RF voltage, primary suppressor 421 is constructed as a plurality of individual GDTs 431-1 through 431-4 connected in series, each GDT 431 being either of the two-electrode or three-electrode variety.

In circuit 411, each supplemental suppressor 427 would also be required to handle higher operational voltages. If a Zener diode is utilized for each supplemental suppressor 427, as shown herein, a Zener diode with a high voltage rating would be required. Alternatively, a novel suppression component could be designed to handle higher operational voltages and therefore used in band pass filter circuit 411 for each supplemental suppressor 427.

Figure 6:
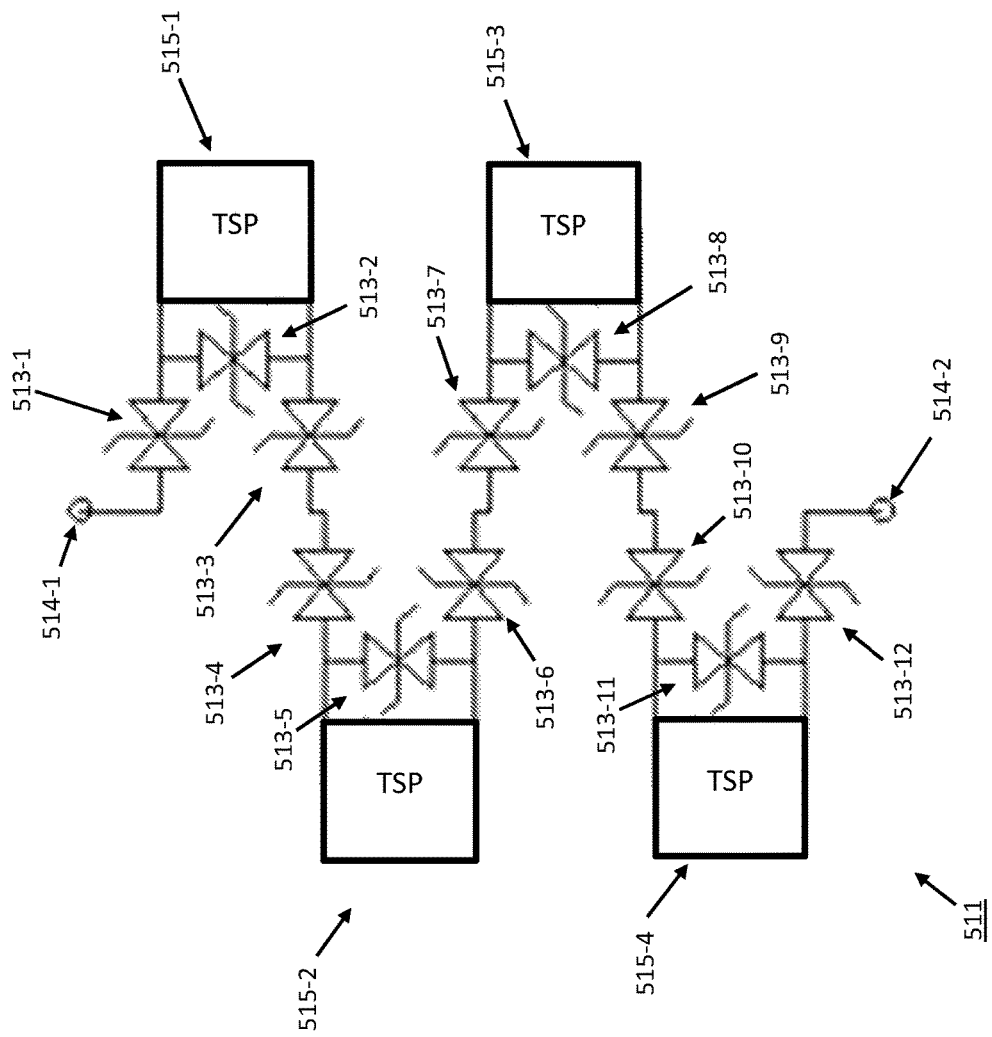
FIG. 6 is a schematic representation of a novel high-voltage suppressor for use in the band pass filter circuit shown in FIG. 5, the suppressor being constructed according to the teachings of the present invention.

In FIG. 6, a novel high-voltage suppression component, or suppressor, is shown, the suppressor being represented generally by reference numeral 511. As can be seen suppressor 511 comprises a plurality of individual Zener diodes 513-1 thru 513-12 connected in series in a zigzag (i.e., alternating direction) configuration between a first terminal 514-1 and a second terminal 514-2. By arranging Zener diodes 513 in a zigzag pattern, its overall series inductance is reduced, since opposite direction devices tend to have cancelling magnetic fields.

Each Zener diode 513 tends to have a considerable resistance. Accordingly, the introduction of higher current creates a commensurate increase in the cumulative voltage produced by suppression component 511.

In order to reduce the cumulative response voltage created by connecting twelve Zener diodes 513 in series, a set of Thyristor Surge Protectors (TSPs) 515-1 thru 515-4 are connected in parallel to select Zener diodes 513. The incorporation of TSPs 515 reduces the response voltage produced by twelve Zener diodes connected in series to a response voltage more commonly associated with approximately eight Zener diodes connected in series. This reduction in the cumulative response voltage ensures that the voltage produced at the output of suppressor 511 does not create an electrical short condition in the band pass filter circuit with which it is used.

Figure 7:
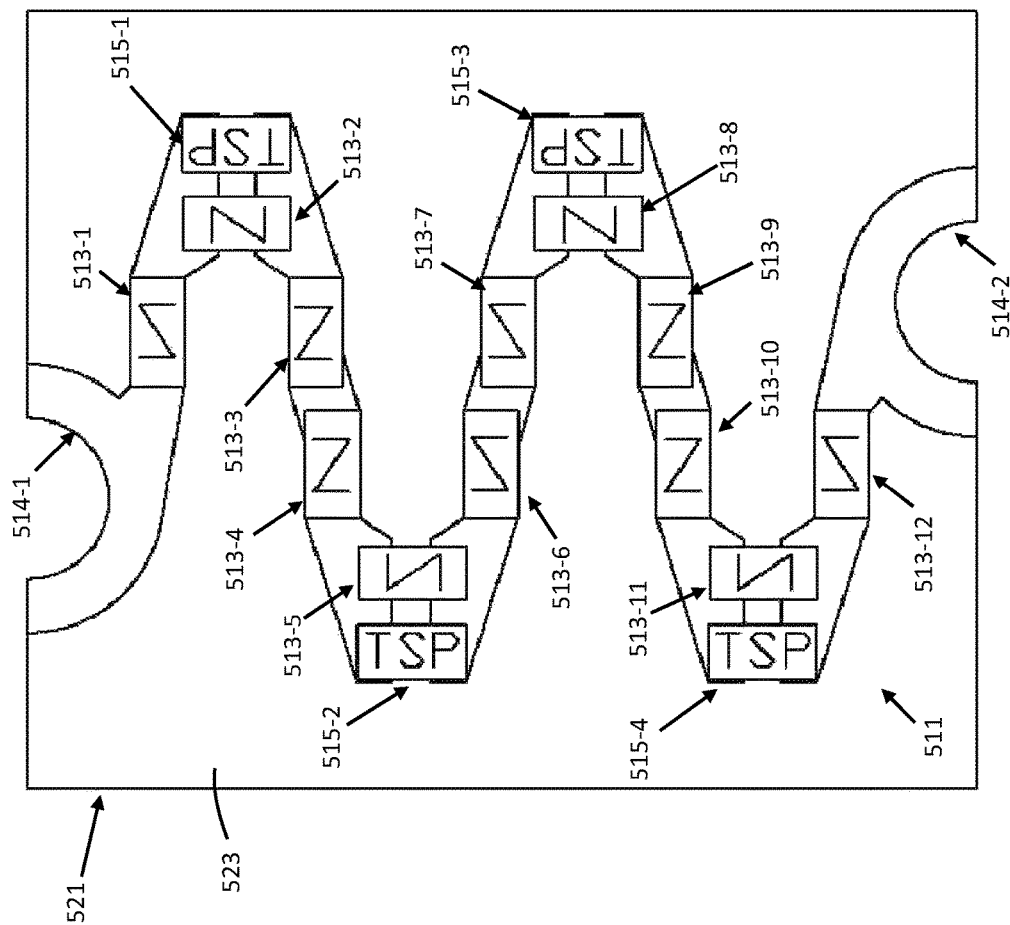
FIG. 7 is a top view of an actual implementation of the high-voltage suppressor shown in FIG. 6, the high-voltage suppressor being shown mounted on a common printed circuit board.

In FIG. 7, an actual implementation of high-voltage suppressor 511 is shown. As can be seen, suppressor 511 is constructed on a common circuit board 521 with a patterned top surface 523. Zener diodes 513-1 thru 513-12 are mounted on patterned top surface 523 and connected in series in a zigzag configuration between first terminal 514-1 and 514-2. Additionally, TSPs 515-1 thru 514-4 are connected in parallel to Zener diodes 513-2, 513-5, 513-8 and 513-11, respectively.

In certain applications, it is desirable to enable a band pass filter circuit to transmit (i.e., not block) signals which fall well below the operational frequency range, such as direct current (DC) signals. Accordingly, band pass filter circuit 111 may be readily modified to allow for the passing of very low frequency and/or DC signals along the transmission line.

Figure 8:
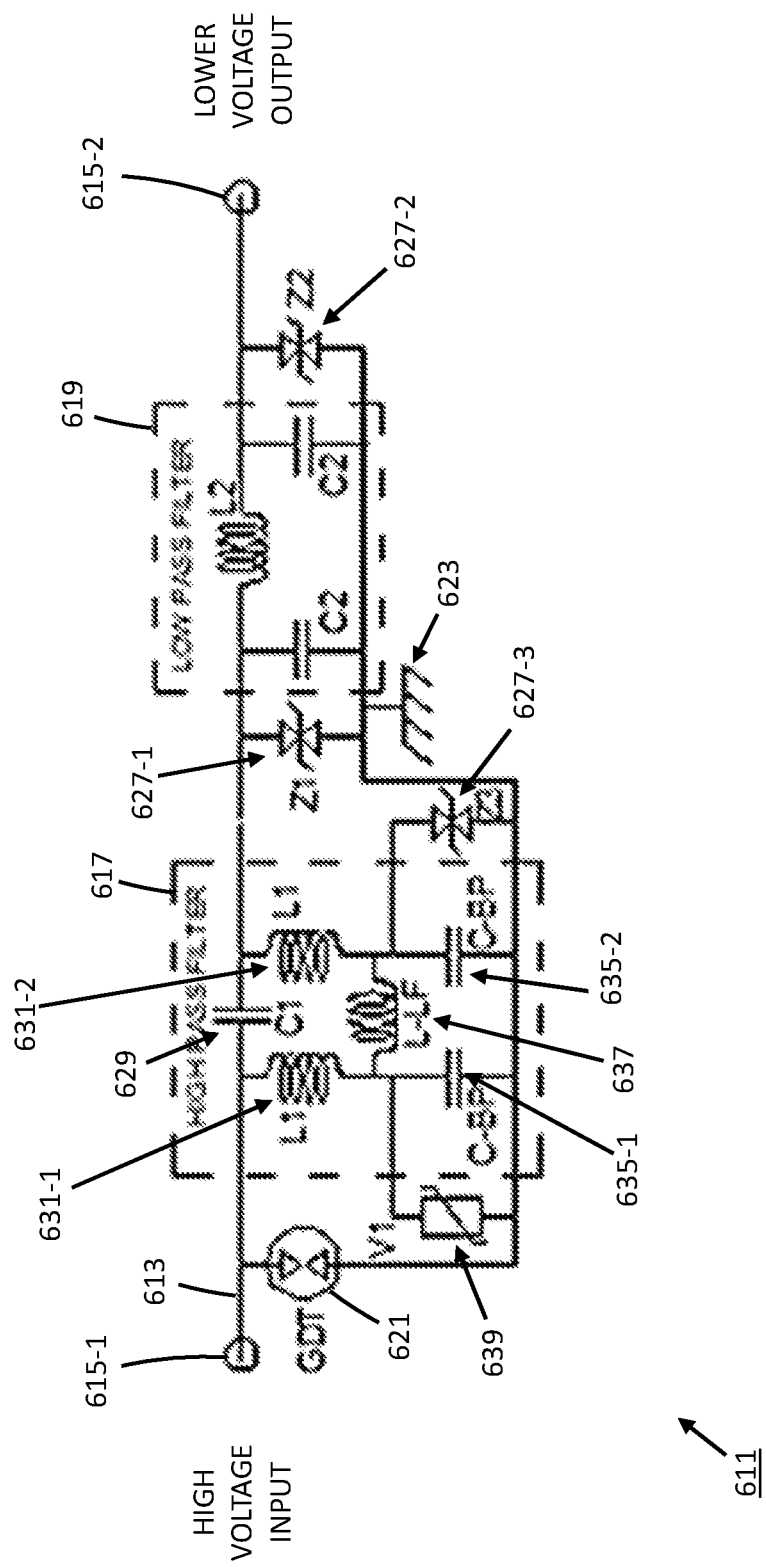
FIG. 8 is a schematic representation of a fifth embodiment of a band pass filter circuit constructed according to the teachings of the present invention.

For instance, in FIG. 8, there is shown a modification to band pass filter circuit 111 that enables very low frequency and DC signals to bypass filtering, the modified band pass filter circuit being identified generally by reference numeral 611. As can be seen, band pass filter circuit 611 is similar to band pass filter circuit 111 in that band pass filter circuit 611 comprises (i) a transmission line, or signal path, 613 that extends in electrical communication between an input, or exposed, terminal 615-1 and an output, or treated, terminal 615-2, (ii) a high pass filter 617 connected to transmission line 613 between input terminal 615-1 and output terminal 615-2, (iii) a low pass filter 619 connected to transmission line 613 between high pass filter 617 and output terminal 615-2, (iv) a primary suppression element, or suppressor, 621 connecting transmission line 613 to a ground terminal, or plane, 623, with primary suppressor 621 being connected to transmission line 613 between input terminal 615-1 and high pass filter 617, and (v) a set of supplemental suppression elements, or suppressors, 627 connecting transmission line 613 to ground terminal 623.

Band pass filter circuit 611 differs primarily from band pass filter circuit 111 in the construction of high pass filter 617. Specifically, high pass filter 617 comprises (i) a series capacitor 629 connected in series with transmission line 613 between input terminal 615-1 and low pass filter 619, and (ii) first and second shunt inductors 631-1 and 631-2 which are connected to transmission line 613 on opposite sides of series capacitor 629. Rather than connect directly to ground 623, each of shunt inductors 631-1 and 631-2 connects to ground 623 via corresponding bypass capacitors 635-1 and 635-2, respectively. A low-frequency inductor 637 connects the bypassed ends of shunt inductors 631 and serves as a path through which very low frequency and/or DC signals can pass through high pass filter 617. To suppress any transient energy present on this low-frequency bypass signal path, a Metal Oxide Varistor (MOV) 639 is connected in parallel with bypass capacitor 635-1 and a third supplemental suppressor 627-3 is connected in parallel with bypass capacitor 635-2. As a result, circuit 611 allows signals within the operational frequency band as well as signals well below the operational frequency band (e.g., DC signals) to pass to output terminal 615-2 while, at the same time, suppresses any transient energy received along the signal path.

Figure 9:
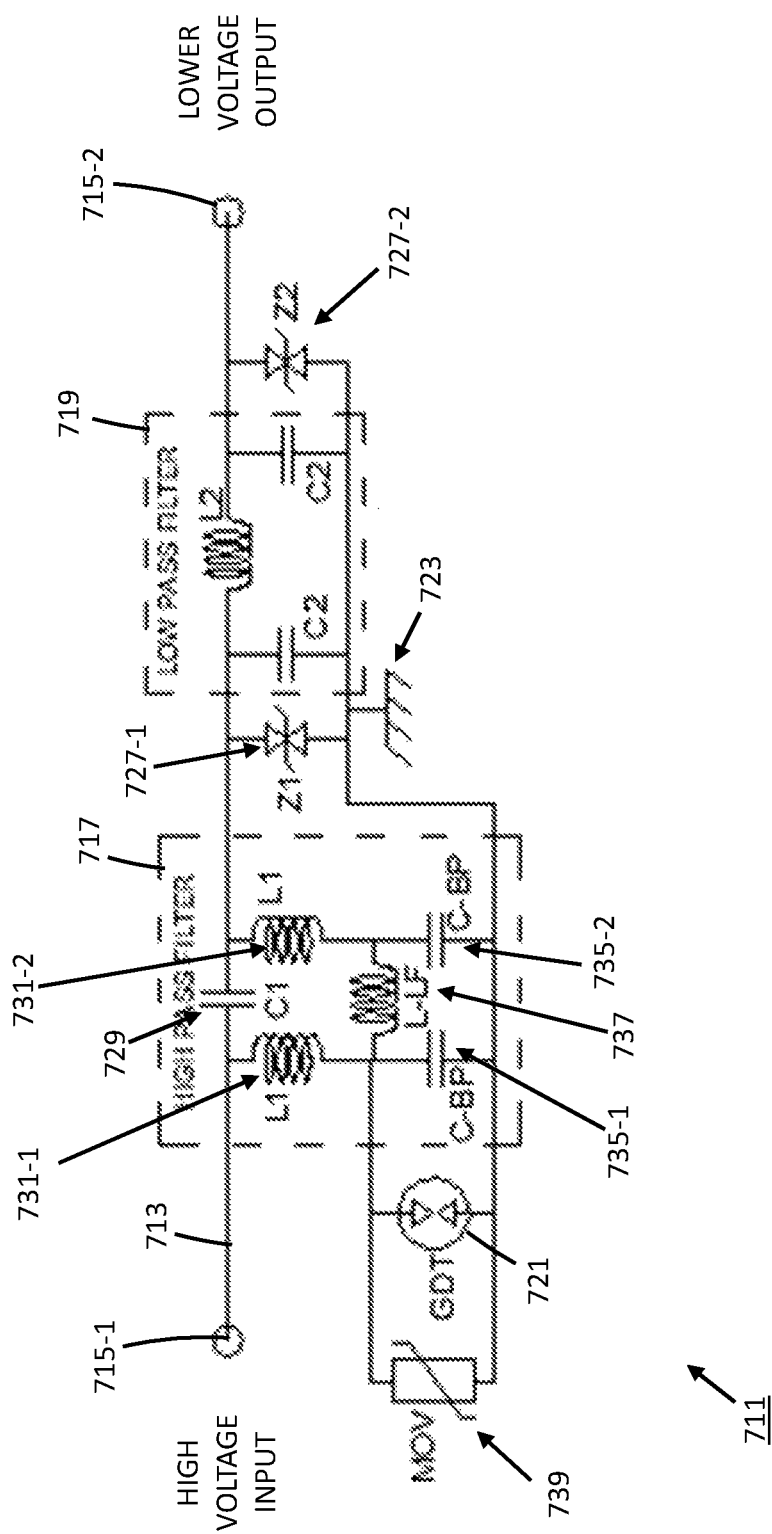
FIG. 9 is a schematic representation of a sixth embodiment of a band pass filter circuit constructed according to the teachings of the present invention.

In FIG. 9, a modification to band pass filter circuit 611 is shown, the modified band pass filter circuit being represented generally by reference numeral 711. As can be seen, band pass filter circuit 711 is similar to band pass filter circuit 611 in that band pass filter circuit 711 comprises (i) a transmission line, or signal path, 713 that extends in electrical communication between an input, or exposed, terminal 715-1 and an output, or treated, terminal 715-2, (ii) a high pass filter 717 connected to transmission line 713 between input terminal 715-1 and output terminal 715-2, (iii) a low pass filter 719 connected to transmission line 713 between high pass filter 717 and output terminal 715-2, (iv) a primary suppression element, or suppressor, 721 connected to a ground terminal 723 for treating transient energy received by transmission line 713, and (v) a set of supplemental suppression elements, or suppressors, 727 connecting transmission line 713 to ground terminal 723.

High pass filter 717 is similar to high pass filter 617 in that high pass filter 717 comprises (i) a series capacitor 729 connected in series with transmission line 713 between input terminal 715-1 and low pass filter 719, and (ii) first and second shunt inductors 731-1 and 731-2 which are connected to transmission line 713 on opposite sides of series capacitor 729. Additionally, rather than connect directly to ground 723, each of shunt inductors 731-1 and 731-2 connects to ground 723 via corresponding bypass capacitors 735-1 and 735-2, respectively. Furthermore, a low-frequency inductor 737 connects the bypassed ends of shunt inductors 731 and serves as a path through which very low frequency and/or DC signals can pass through high pass filter 717.

High pass filter 717 differs from high pass filter 617 in its design for suppressing transient energy. Specifically, both primary suppressor 721 and a Metal Oxide Varistor (MOV) 739 are connected in parallel with bypass capacitor 735-1. As a result, any transient energy present along transmission line 713 that is received by high pass filter 717 initially passes through inductor 731-1 and is then treated by primary suppressor 721 with any supplemental transient suppression required along the low-frequency bypass signal path being afforded by MOV 739. As a result, a supplemental suppressor 727 designated to treat transients along the low-frequency bypass signal path is no longer required.

Figure 10:
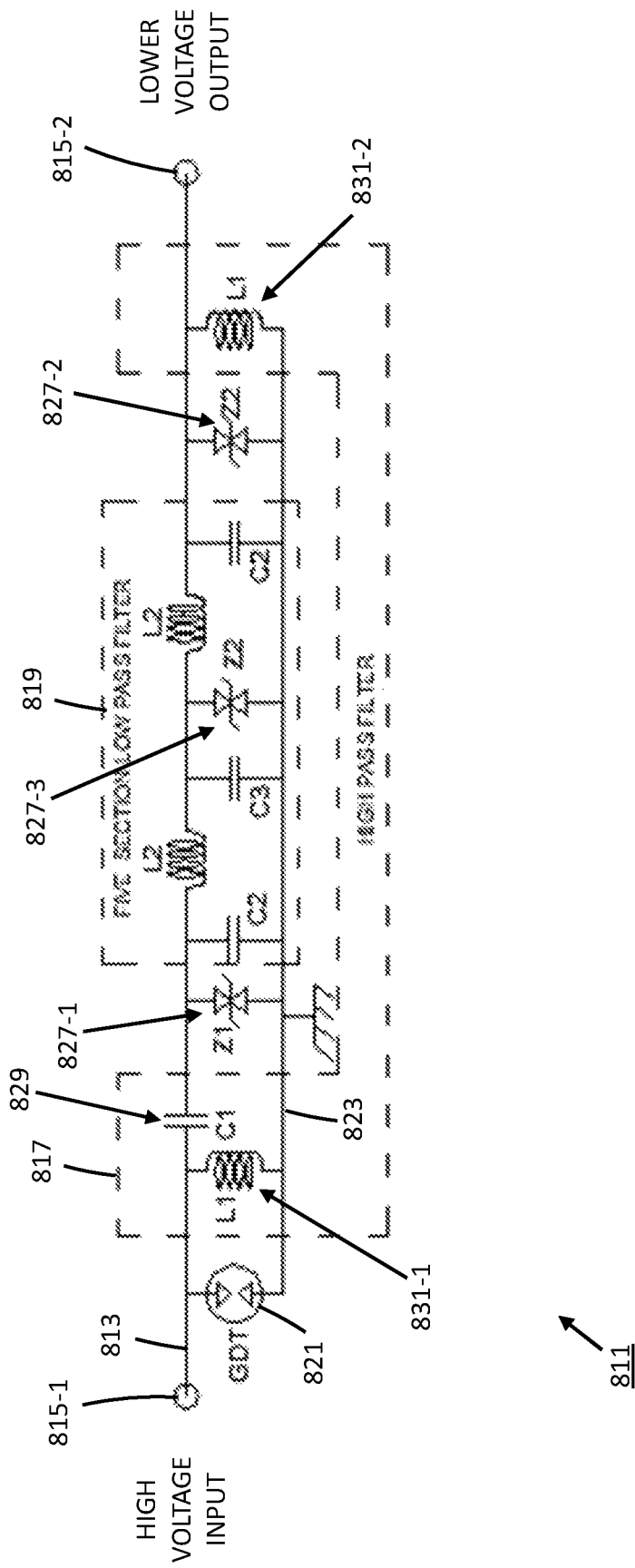
FIG. 10 is a schematic representation of a seventh embodiment of a band pass filter circuit constructed according to the teachings of the present invention.

Referring now to FIG. 10, there is shown a seventh embodiment of a band pass filter circuit constructed according to the teachings of the present invention, the circuit being defined generally by reference numeral 811. As can be seen, band pass filter circuit 811 is similar to band pass filter circuit 211 in that band pass filter circuit 811 comprises (i) a transmission line, or signal path, 813 that extends in electrical communication between an input, or exposed, terminal 815-1 and an output, or treated, terminal 815-2, (ii) a high pass filter 817 connected to transmission line 813 between input terminal 815-1 and output terminal 815-2, (iii) a low pass filter 819 connected to transmission line 813 between high pass filter 817 and output terminal 815-2, (iv) a primary suppression element, or suppressor, 821 connecting transmission line 813 to a ground terminal, or plane, 823, with primary suppressor 821 being connected to transmission line 813 between input terminal 815-1 and high pass filter 817, and (v) a set of supplemental suppression elements, or suppressors, 827 connecting transmission line 813 to ground terminal 823.

Band pass filter circuit 811 differs primarily from band pass filter circuit 211 in the configuration of high pass filter 817 in relation to the remainder of circuit 811. Specifically, high pass filter 817 is similar to high pass filter 217 in that high pass filter 817 comprises (i) a series capacitor 829 connected in series with transmission line 813 between input terminal 815-1 and low pass filter 819, and (ii) first and second shunt inductors 831-1 and 831-2 which extend between transmission line 813 and ground terminal 823.

First shunt inductor 831-1 is connected to transmission line 813 between input terminal 815-1 and series capacitor 829. However, second shunt inductor 831-2 is connected to transmission line 813 after low pass filter 819 and supplemental suppressor 827-2 (i.e., towards output terminal 815-2). As such, low pass filter 819 is effectively nested within high pass filter 817. Configuring high pass filter 817 in this fashion provides beneficial DC shunting of the output. Consequently, any unwanted low-frequency energy at output terminal 815-2 (e.g., low-frequency reflections) can be reduced.

Figure 11:
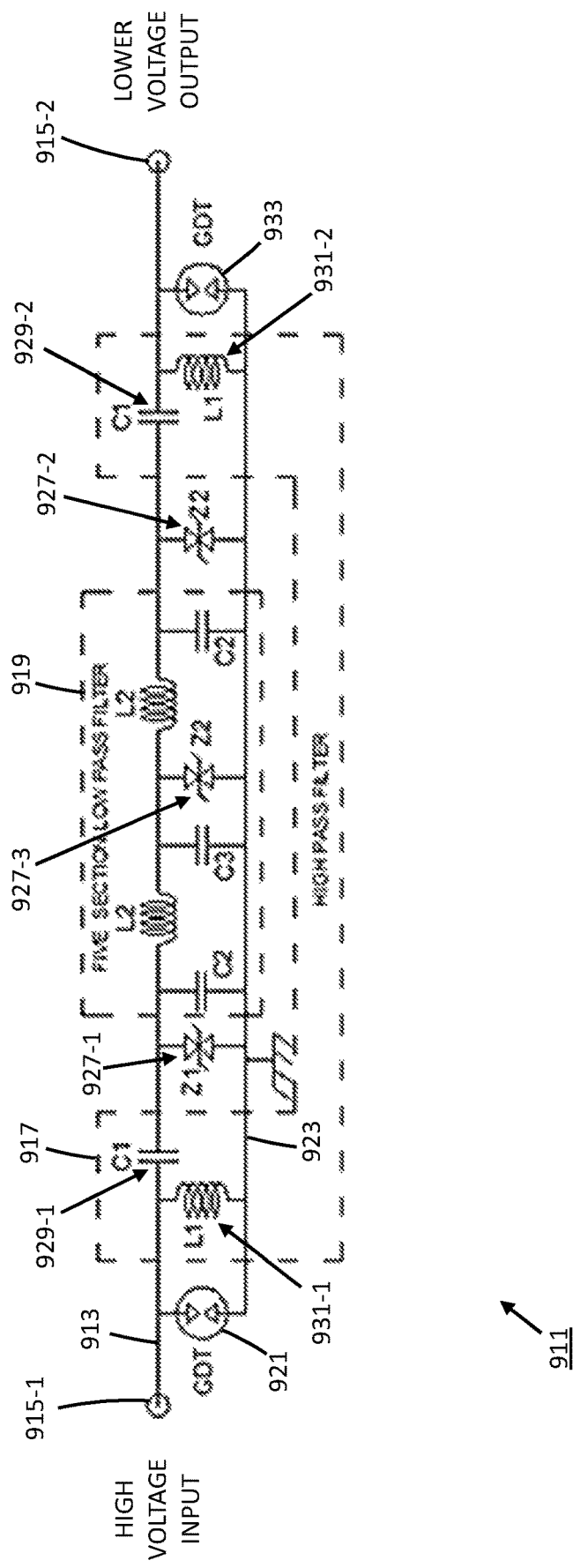
FIG. 11 is a schematic representation of an eighth embodiment of a band pass filter circuit constructed according to the teachings of the present invention.

Referring now to FIG. 11, there is shown an eighth embodiment of a band pass filter circuit constructed according to the teachings of the present invention, the circuit being defined generally by reference numeral 911. As can be seen, band pass filter circuit 911 is similar to band pass filter circuit 811 in that band pass filter circuit 911 comprises (i) a transmission line, or signal path, 913 that extends in electrical communication between an input, or exposed, terminal 915-1 and an output, or treated, terminal 915-2, (ii) a high pass filter 917 connected to transmission line 913 between input terminal 915-1 and output terminal 915-2, (iii) a low pass filter 919 connected to transmission line 913 between high pass filter 917 and output terminal 915-2, (iv) a primary suppression element, or suppressor, 921 connecting transmission line 913 to a ground terminal, or plane, 923, with primary suppressor 921 being connected to transmission line 913 between input terminal 915-1 and high pass filter 917, and (v) a set of supplemental suppression elements, or suppressors, 927 connecting transmission line 913 to ground terminal 923.

Band pass filter circuit 911 differs slightly from band pass filter circuit 811 in the construction and configuration of high pass filter 917. Specifically, high pass filter 917 is similar to high pass filter 817 in that high pass filter 917 comprises (i) a first series capacitor 929-1 connected in series with transmission line 913 between input terminal 915-1 and low pass filter 919, and (ii) first and second shunt inductors 931-1 and 931-2 which extend between transmission line 913 and ground terminal 923, with first shunt inductor 931-1 connected to transmission line 913 between input terminal 915-1 and first series capacitor 929-1 and second shunt inductor 931-2 connected to transmission line 913 after low pass filter 919 and supplemental suppressor 927-2 (i.e., towards output terminal 915-2).

Band pass filter circuit 911 differs from band pass filter circuit 811 in that high pass filter 917 includes an additional series capacitor 929-2 which is connected in series with transmission line 913 after low pass filter 919 and supplemental suppressor 927-2. Because capacitors 929-1 and 929-2 are connected in series, the value of each capacitor 929 is preferably half the value of series capacitor 829 in circuit 811.

Additionally, a secondary GDT 933 connects transmission line 913 to ground terminal 923. Preferably, secondary GDT 933 is connected to transmission line 913 after shunt inductor 931-2 of high pass filter 917. The addition of second series capacitor 929-2 and GDT 933 helps further reduce any unwanted low-frequency energy present at output terminal 915-2 (e.g., low-frequency reflections).

For each of the band pass filter circuits described in detail above, it has been found that constructing the input side components (e.g., the high pass filter) in close proximity to the output side components (e.g., low pass filter) can create parasitic capacitance which, in turn, can cause an unwanted increase in the output voltage. To remedy this condition, shielding is preferred between the input side and output side components.

Figure 12A:
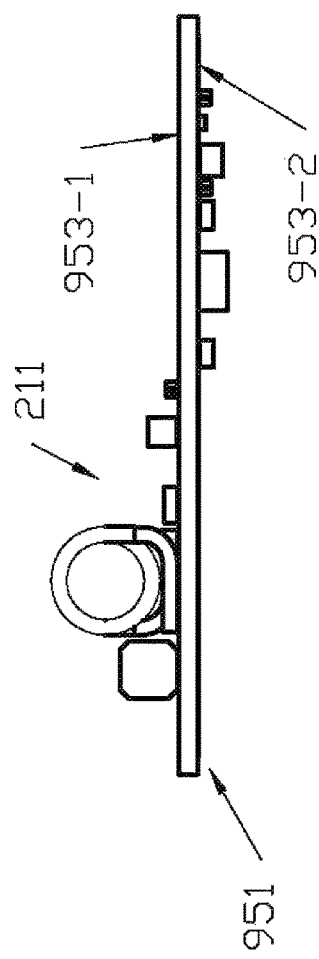
FIGS. 12(a)-(c) are front, top, and bottom views, respectively, of an actual implementation of the band pass filter circuit shown in FIG. 3, the band pass filter being shown mounted on a common printed circuit board.
Figure 12C:
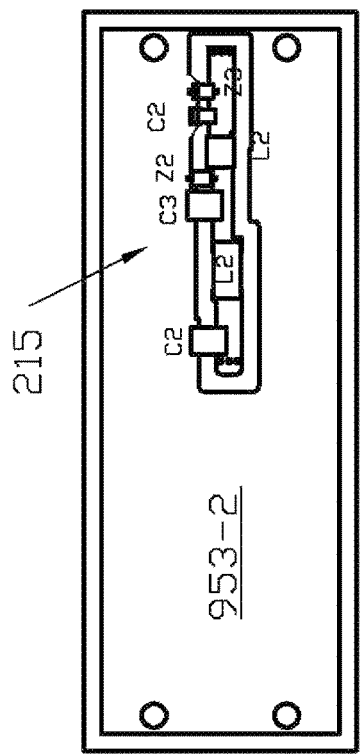
Figure 12B:
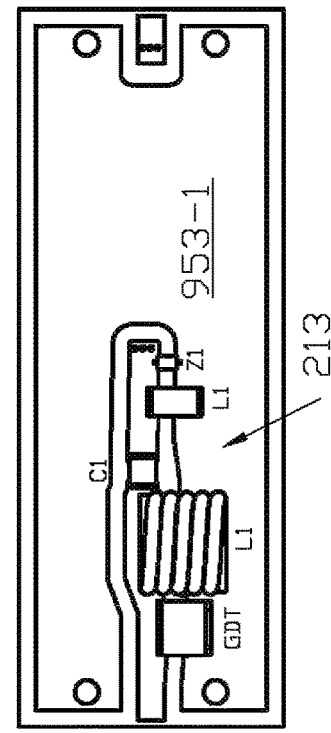

Shielding may be accomplished, for example, by constructing each band pass filter circuit on a dual-sided circuit board with the input side components and the output side components mounted on opposing surfaces. For example, in FIGS. 12(a)-(c), band pass filter circuit 211 is shown mounted on a common circuit board 951 which includes a top surface 953-1 and a bottom surface 953-2.

As can be seen, the input side components (primarily high pass filter 213) are mounted on top surface 953-1 and the output side components (primarily low pass filter 215) are mounted on bottom surface 953-2. This double-sided construction can be achieved by inverting the surfaces on which ground plane 223 and signal path 213 are mounted at a suitable location between filters 213 and 215. As such, dielectric printed circuit board 951 creates a sufficient electrical shield between the input side components and the output side components.

What is claimed is:

1. A band pass filter circuit for transmitting electromagnetic signals of an operational frequency band, the band pass filter circuit comprising:
   (a) a transmission line connecting an input terminal to an output terminal;
   (b) a high pass filter for blocking transmission to the output terminal of electromagnetic signals received by the transmission line that fall below the operational frequency band, at least a portion of the high pass filter being connected in series with the transmission line between the input terminal and the output terminal;
   (c) a low pass filter for blocking transmission to the output terminal of electromagnetic signals received by the transmission line that fall above the operational frequency band, the low pass filter being separate from the high pass filter, at least a portion of the low pass filter being connected in series with the transmission line between the high pass filter and the output terminal;
   (d) a primary suppressor for clamping high-voltage, transient electromagnetic energy received by the transmission line, the primary suppressor connecting the transmission line to a ground terminal, the primary suppressor being connected to the transmission line between the input terminal and the high pass filter; and
   (e) a set of supplemental suppressors for clamping high-voltage, transient electromagnetic energy received by the transmission line, each of the set of supplemental suppressors connecting the transmission line to the ground terminal, each of the set of supplemental suppressors being connected to the transmission line between the high pass filter and the output terminal.

2. The band pass filter circuit as claimed in claim 1 wherein the low pass filter comprises a plurality of shunt capacitors which extend between the transmission line and the ground terminal.

3. The band pass filter circuit as claimed in claim 2 wherein each shunt capacitor of the low pass filter is paired in parallel with a corresponding supplemental suppressor.

4. The band pass filter circuit as claimed in claim 3 wherein each of the plurality of shunt capacitors and each of the set of supplemental suppressors has a capacitance, wherein the capacitance of each of the plurality of shunt capacitors in the low pass filter is greater than two times the capacitance of the supplemental suppressor with which it is paired in parallel.

5. The band pass filter circuit as claimed in claim 4 wherein the capacitance of each of the plurality of shunt capacitors in the low pass filter is greater than five times the capacitance of the supplemental suppressor with which it is paired in parallel.

6. The band pass filter circuit as claimed in claim 4 wherein the set of supplemental suppressors comprises:
   (a) a first supplemental suppressor connected to the transmission line between the high pass filter and the low pass filter; and
   (b) a second supplemental suppressor connected to the transmission line between the low pass filter and the output terminal.

7. The band pass filter circuit as claimed in claim 3 wherein the primary suppressor is in the form of a gas discharge tube.

8. The band pass filter circuit as claimed in claim 7 wherein the primary suppressor is in the form of a plurality of gas discharge tubes connected in series.

9. The band pass filter circuit as claimed in claim 3 wherein the low pass filter comprises:
   (a) a first series inductor connected in series with the transmission line between the high pass filter and the output terminal;
   (b) a second series inductor connected in series with the transmission line between the first series inductor and the output terminal;
   (c) a first shunt capacitor extending between the transmission line and the ground terminal, the first shunt capacitor being connected to the transmission line between the high pass filter and the first series inductor;
   (d) a second shunt capacitor extending between the transmission line and the ground terminal, the second shunt capacitor being connected to the transmission line between the second series inductor and the output terminal; and
   (e) one of the set of supplemental suppressors extending between the transmission line and the ground terminal, the one of the set of supplemental suppressors being connected to the transmission line between the first and second series inductors.

10. The band pass filter circuit as claimed in claim 3 wherein the high pass filter comprises:
    (a) a first series capacitor connected in series with the transmission line between the input terminal and the low pass filter;
    (b) a first shunt inductor extending between the transmission line and the ground terminal, the first shunt inductor being connected to the transmission line between the input terminal and the first capacitor; and
    (c) a second shunt inductor extending between the transmission line and the ground terminal, the second shunt capacitor being connected to the transmission line between the first series capacitor and the output terminal.

11. The band pass filter circuit as claimed in claim 10 wherein the second shunt inductor of the high pass filter is connected to the transmission line between low pass filter and the output terminal.

12. The band pass filter circuit as claimed in claim 10 wherein the high pass filter further comprises:
    (a) a first bypass capacitor connected in series with the first shunt inductor, the first bypass capacitor connecting the first shunt inductor with the ground terminal;
    (b) a second bypass capacitor connected in series with the second shunt inductor, the second bypass capacitor connecting the second shunt inductor with the ground terminal; and
    (c) a low frequency inductor connected at a first end between the first shunt inductor and the first bypass capacitor and at a second end between the second shunt inductor and the second bypass capacitor.

13. The band pass filter circuit as claimed in claim 3 further comprising a common printed circuit board on which the transmission line, the high pass filter, the low pass filter, the primary suppressor, and the set of supplemental suppressors are mounted, the common printed circuit board having first and second opposing surfaces.

14. The band pass filter circuit as claimed in claim 13 wherein the high pass filter is mounted on the first opposing surface of the common printed circuit board and the low pass filter is mounted on the second opposing surface of the common printed circuit board.

15. The band pass filter circuit as claimed in claim 3 wherein one of the set of supplemental suppressors is a gas discharge tube which is shunt connected to the transmission line between the low pass filter and the output terminal.

16. The band pass filter circuit as claimed in claim 3 wherein one of the set of supplemental suppressors is in the form of a plurality of Zener diodes connected in series, the plurality of Zener diodes being arranged in a zig-zag configuration.

17. The band pass filter circuit as claimed in claim 16 wherein at least one thyristor surge protector (TSP) is connected in parallel with one of the plurality of Zener diodes connected in series in a zig-zag configuration.

* * * * *